US010181582B2

(12) United States Patent
Matsusue et al.

(10) Patent No.: US 10,181,582 B2
(45) Date of Patent: Jan. 15, 2019

(54) ORGANIC EL ELEMENT COMPRISING FIRST AND SECOND INTERLAYERS OF SPECIFIED MATERIALS AND THICKNESSES, AND METHOD FOR MANUFACTURING THEREOF

(71) Applicant: JOLED INC., Tokyo (JP)

(72) Inventors: Noriyuki Matsusue, Tokyo (JP); Hiroshi Katagiri, Tokyo (JP)

(73) Assignee: JOLED INC., Tokyo (JP)

( * ) Notice: Subject to any disclaimer, the term of this patent is extended or adjusted under 35 U.S.C. 154(b) by 8 days.

(21) Appl. No.: 15/124,476

(22) PCT Filed: Feb. 24, 2015

(86) PCT No.: PCT/JP2015/000927
§ 371 (c)(1),
(2) Date: Sep. 8, 2016

(87) PCT Pub. No.: WO2015/141144
PCT Pub. Date: Sep. 24, 2015

(65) Prior Publication Data
US 2017/0033314 A1 Feb. 2, 2017

(30) Foreign Application Priority Data

Mar. 18, 2014 (JP) ................................ 2014-055259

(51) Int. Cl.
*H01L 51/52* (2006.01)
*H01L 51/54* (2006.01)
(Continued)

(52) U.S. Cl.
CPC ...... *H01L 51/5259* (2013.01); *H01L 51/5092* (2013.01); *H01L 51/5228* (2013.01);
(Continued)

(58) Field of Classification Search
CPC ............ H01L 51/5237; H01L 51/5253; H01L 51/5259; H01L 2251/558
See application file for complete search history.

(56) References Cited

U.S. PATENT DOCUMENTS 6,483,236 B1 * 11/2002 Hung .................. H01L 51/5012
313/504
2003/0184222 A1 * 10/2003 Nilsson .................. H05B 33/04
313/512

(Continued)

FOREIGN PATENT DOCUMENTS

JP 2005-063834 3/2005
JP 2005-183013 7/2005

(Continued)

OTHER PUBLICATIONS

English machine translation of JP2006-066553A of record.*

(Continued)

*Primary Examiner* — Yu Chen
*Assistant Examiner* — Christopher M Roland
(74) *Attorney, Agent, or Firm* — Greenblum & Bernstein, P.L.C.

(57) ABSTRACT

An organic EL element including an anode; a light-emitting layer above the anode; a first interlayer on the light-emitting layer, the first interlayer including a fluoride of a first metal that is an alkali metal or alkaline earth metal; a second interlayer on the first interlayer, the second interlayer including a second metal that has a property of cleaving a bond between the first metal and fluorine in the fluoride; a cathode on the second interlayer; and a sorption layer above the cathode, the sorption layer including a third metal that has a property of taking up and holding at least one of moisture (Continued)

and oxygen. A thickness D1 of the first interlayer and a thickness D2 of the second interlayer satisfy 5%≤D2/D1≤25%.

20 Claims, 11 Drawing Sheets

(51) Int. Cl.
*H01L 51/50* (2006.01)
*H01L 51/56* (2006.01)
*H01L 27/32* (2006.01)

(52) U.S. Cl.
CPC ...... *H01L 51/5234* (2013.01); *H01L 51/5262* (2013.01); *H01L 51/56* (2013.01); *H01L 27/3246* (2013.01); *H01L 51/5237* (2013.01); *H01L 51/5253* (2013.01); *H01L 2227/323* (2013.01); *H01L 2251/301* (2013.01); *H01L 2251/558* (2013.01)

(56) References Cited

U.S. PATENT DOCUMENTS

| | | | |
|---|---|---|---|
| 2005/0127824 A1* | 6/2005 | Mori | H01L 51/5048 313/504 |
| 2006/0097632 A1 | 5/2006 | Ryu | |
| 2007/0020483 A1 | 1/2007 | Park et al. | |
| 2007/0210705 A1 | 9/2007 | Yokoi et al. | |
| 2007/0292681 A1 | 12/2007 | Okuda et al. | |
| 2013/0062658 A1 | 3/2013 | Satoh et al. | |
| 2015/0008414 A1 | 1/2015 | Isobe | |
| 2016/0141539 A1 | 5/2016 | Hoang et al. | |

FOREIGN PATENT DOCUMENTS

| | | |
|---|---|---|
| JP | 2006-012428 | 1/2006 |
| JP | 2006-066553 | 3/2006 |
| JP | 2006-135337 | 5/2006 |
| JP | 2007-036175 | 2/2007 |
| JP | 2008-004637 | 1/2008 |
| JP | 4882508 | 2/2012 |
| JP | 2013-025976 | 2/2013 |
| JP | 2013-161673 | 8/2013 |
| WO | 2013/035136 | 3/2013 |
| WO | 2013/118462 | 8/2013 |

OTHER PUBLICATIONS

International Search Report (ISR) from International Searching Authority (Japan Patent Office) in International Pat. Appl. No. PCT/JP2015/000927, dated Apr. 28, 2015.

* cited by examiner

ORGANIC EL ELEMENT COMPRISING FIRST AND SECOND INTERLAYERS OF SPECIFIED MATERIALS AND THICKNESSES, AND METHOD FOR MANUFACTURING THEREOF

TECHNICAL FIELD

The present invention relates to organic electroluminescence (EL) elements and methods for manufacturing organic EL elements, and in particular to storage stability and light-emitting properties of organic EL elements.

BACKGROUND ART

In recent years, display devices employing organic EL elements have become widespread owing to characteristics of the organic EL elements such as a high visibility resulting from self-luminescence and an excellent shock resistance resulting from a fully solid-state structure.

According to a structure of an organic EL element, at least a light-emitting layer is disposed between a pair of electrodes (an anode and a cathode). Further, the organic EL element typically includes, between the light-emitting layer and the cathode, a functional layer (an electron transport layer, an electron injection layer) for supplying electrons to the light-emitting layer, a hole injection layer, a hole transport layer, and so on. Also, it is known that an excellent electron injection property is exhibited by functional layers made of an alkali metal or an alkaline-earth metal having a low work function.

Alkali metals and alkaline-earth metals that have a low work function react easily with impurities such as moisture and oxygen. For this reason, impurities degrade the functional layer that includes an alkali metal or an alkaline-earth metal. This exercises an adverse effect such as degradation of light emission efficiency and reduction of light-emitting lifetime of the organic EL element, and degrades storage stability. Also, contact between impurities and a cathode causes corrosion and degradation of the cathode. This can cause the same adverse effects described above.

In view of this problem, Patent Literature 1 discloses an organic EL element including an inorganic barrier layer between a hole injection layer and a hole transport layer, between the hole transport layer and a light-emitting layer, between the light-emitting layer and an electron transport layer, or between the electron transport layer and an electron injection layer (these layers are referred to as organic light-emitting medium layers in Patent Literature 1). The inorganic barrier layers are provided in order to prevent one or more of the organic light-emitting medium layers, which are formed subsequent to the corresponding inorganic barrier layers, from being degraded by impurities that are adsorbed onto surfaces of a remainder of the organic light-emitting medium layers, which are formed prior to the corresponding inorganic barrier layers (the impurities are referred to as a degradation factor in Patent Literature 1).

CITATION LIST

Patent Literature

[Patent Literature 1] Japanese Patent No. 4882508

SUMMARY OF INVENTION

Technical Problem

According to the organic EL element disclosed in Patent Literature 1, the inorganic barrier layers are each made of insulator, semiconductor, or metal having a work function of 4.0 eV or higher, and have a low electron injection property. Accordingly, sufficient electrons are not supplied to a light-emitting layer, and as a result an excellent light emission property may not be exhibited.

Further, the organic light-emitting medium layers formed after the barrier layers and the cathode layer are degraded by external impurities and as a result an excellent light emission property may not be exhibited.

The present invention was made in view of the above problem, and aims to provide an organic EL element and a manufacturing method of the organic EL element according to which an excellent storage stability is exhibited by sufficiently blocking external impurities, not only impurities from layers formed before the barrier layer, and an excellent light emission property is exhibited.

Solution to Problem

An organic EL element that is one aspect of the present invention includes: an anode; a light-emitting layer disposed above the anode; a first interlayer disposed on the light-emitting layer, the first interlayer including a fluoride that includes a first metal that is an alkali metal or alkaline earth metal; a second interlayer disposed on the first interlayer, the second interlayer including a second metal that has a property of cleaving a bond between the first metal and fluorine in the fluoride; a cathode disposed on the second interlayer; and a sorption layer disposed above the cathode, the sorption layer including a third metal that has a property of taking up and holding at least one of moisture and oxygen. A thickness $D1$ of the first interlayer and a thickness $D2$ of the second interlayer satisfy $5\% \leq D2/D1 \leq 25\%$.

Advantageous Effects of Invention

The organic EL element pertaining to the one aspect of the present invention includes the first interlayer and the second interlayer. The first interlayer includes a fluorine compound including the first metal that is an alkali metal or an alkaline-earth metal. Accordingly, the first interlayer has a high property of blocking impurities. This blocks intrusion of impurities from the light-emitting layer to suppress degradation of the cathode, and maintains excellent light emission properties. Also, the second metal, which is included in the second interlayer, cleaves the bond between the first metal and fluorine in the fluorine compound including the first metal, which is included in the first interlayer, to liberate the first metal. The liberated first metal is an alkali metal or an alkaline-earth metal, and accordingly has a low work function and a high electron injection property. Therefore, electrons are sufficiently supplied to the light-emitting layer.

Here, if an amount of the liberated first metal is small, electrons are not sufficiently supplied to the light-emitting layer, and as a result a sufficient luminance is not exhibited. In contrast, if an amount of the liberated first metal is excessively large, an amount of supplied electrons is excessively large relative to an amount of holes in the light-emitting layer. This results in degradation of light emission efficiency (luminance relative to current).

According to the organic EL element pertaining to one aspect of the present invention, the thickness $D1$ of the first interlayer and the thickness $D2$ of the second interlayer satisfy $5\% \leq D2/D1 \leq 25\%$, which represents a preferable range in balancing the property of blocking impurities and the property of supplying electrons, and therefore an excellent light emission efficiency is exhibited.

Further, according to the organic EL element pertaining to one aspect of the present invention, the sorption layer that includes the third metal, which has the property of taking up and holding impurities (moisture and oxygen), is disposed above the cathode. The sorption layer blocks intrusion of external impurities, thereby suppressing degradation of the cathode, the first interlayer, and the second interlayer, and therefore an excellent storage stability is exhibited.

Also, according to the method of manufacturing the organic EL element pertaining to another aspect of the present invention, the same effects are exhibited.

BRIEF DESCRIPTION OF DRAWINGS

FIG. 7A shows a state in which a TFT layer and an interlayer insulating layer are formed on a substrate. FIG. 7B shows a state in which an anode is formed on the interlayer insulating layer. FIG. 7C shows a state in which a bank material layer is formed on the interlayer insulating layer and the anode.

FIG. 8A shows a state in which a bank layer is formed. FIG. 8B shows a state in which a hole injection layer is formed on the anode within an opening of the bank layer. FIG. 8C shows a state in which a hole transport layer is formed on the hole injection layer within the opening of the bank layer.

FIG. 9A shows a state in which a light-emitting layer is formed on the hole transport layer within the opening of the bank layer. FIG. 9B shows a state in which the first interlayer is formed on the light-emitting layer and the bank layer. FIG. 9C shows a state in which the second interlayer is formed on the first interlayer.

FIG. 10A shows a state in which a cathode thin film layer is formed on the second interlayer. FIG. 10B shows a state in which an auxiliary cathode layer is formed on the cathode thin film layer. FIG. 10C shows a state in which the sorption layer is formed on the auxiliary cathode layer. FIG. 10D shows a state in which a sealing layer is formed on the sorption layer.

DESCRIPTION OF EMBODIMENTS

Figure 1:
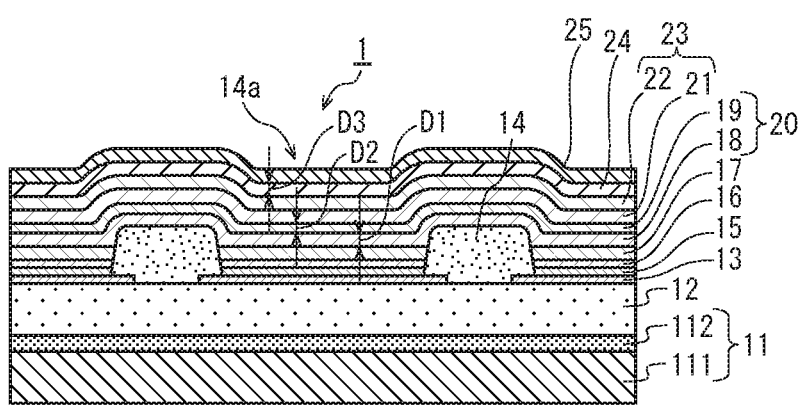
FIG. 1 is a cross-section schematically showing a structure of organic EL element 1 pertaining to an embodiment of the present invention.

<Outline of One Aspect of the Present Invention>

An organic EL element pertaining to one aspect of the present invention includes: an anode; a light-emitting layer disposed above the anode; a first interlayer disposed on the light-emitting layer, the first interlayer including a fluoride that includes a first metal that is an alkali metal or alkaline earth metal; a second interlayer disposed on the first interlayer, the second interlayer including a second metal that has a property of cleaving a bond between the first metal and fluorine in the fluoride; a cathode disposed on the second interlayer; and a sorption layer disposed above the cathode, the sorption layer including a third metal that has a property of taking up and holding at least one of moisture and oxygen. A thickness $D1$ of the first interlayer and a thickness $D2$ of the second interlayer satisfy $5\% \leq D2/D1 \leq 25\%$.

Thus, the ratio of the thickness $D2$ of the second interlayer to the thickness $D1$ of the first interlayer is in a preferred range in terms of the balance between the property of blocking impurities from the light-emitting layer to the cathode and the property of supplying electrons from the cathode to the light-emitting layer. Therefore, an excellent light emission property is exhibited. Further, the sorption layer takes up, holds, and blocks impurities from outside, and thereby degradation of the cathode, the first interlayer, and the second interlayer by impurities can be suppressed.

Further, according to a specific example of the organic EL element pertaining to the one aspect of the present invention, the third metal is an alkali metal or an alkaline-earth metal.

The third metal is an alkali metal or alkaline earth metal that has a comparatively low work function and a high reactivity with impurities, and therefore reacts with impurities that intrude from outside and works to capture impurities within the sorption layer. This blocks intrusion of impurities to the cathode from outside to suppress degradation of the cathode, and maintains excellent light emission properties.

Further, according to a specific example of the organic EL element relating to the one aspect of the present invention, the thickness $D1$ is from 1 nm to 10 nm.

Thus, the thickness $D1$ of the first interlayer can ensure a property of sufficiently blocking impurities while preventing degradation of the electron injection property due to an excessively large value of the thickness $D1$.

Further, according to a specific example of the organic EL element pertaining to the one aspect of the present invention, the thickness $D2$ is from 0.2 nm to 1 nm.

Thus, the second interlayer exhibits a preferable electron injection property for injecting electrons, of an amount neither too large nor too small, to the light-emitting layer. This exhibits an excellent light emission efficiency.

Further, according to a specific example of the organic EL element pertaining to the one aspect of the present invention, thickness of the sorption layer is from 5 nm to 12 nm.

The sorption layer includes the third metal, and therefore would absorb light if too thick, which would prevent efficient extraction of light emitted from the light-emitting layer. Accordingly, by setting the thickness of the sorption layer from 5 nm to 12 nm, impurities from outside are sufficiently blocked while suppressing absorption of light to allow efficient light extraction.

Further, according to a specific example of the organic EL element pertaining to the one aspect of the present invention, the cathode includes a cathode thin film layer made from metal and a cathode auxiliary layer disposed on the cathode thin film layer, the cathode auxiliary layer having at least one of an electron transporting property and an electron injecting property.

When the cathode thin film layer is very thin, electrical resistivity of the cathode thin film layer is high. Thus, voltage supplied to a peripheral portion of the cathode thin film layer decreases in a central portion of the cathode thin film layer due to voltage drop, which can lead to uneven luminance. According to the specific example of the organic EL element pertaining to the one aspect of the present invention, the cathode auxiliary layer is disposed on the cathode thin film layer and therefore current supplied to the peripheral portion of the cathode thin film layer can flow through the cathode auxiliary layer in addition to the cathode thin film layer. Thus, voltage drop in the central portion of the cathode thin film layer is reduced and occurrence of uneven luminance is suppressed.

Further, according to a specific example of the organic EL element pertaining to the one aspect of the present invention, the second metal is an alkali metal or an alkaline-earth metal.

The second metal is an alkali metal or an alkaline-earth metal, which has a comparatively low work function and a comparatively high electron supply property. Therefore, the second metal has a comparatively high reactivity with fluorine and easily cleaves the bond between the first metal and fluorine. Thus, electron injection is efficiently promoted from the first intermediate layer to the light-emitting layer.

Further, according to a specific example of the organic EL element pertaining to the one aspect of the present invention, the third metal has a property of cleaving a bond between the first metal and the fluorine in the fluoride included in the first interlayer.

When the third metal is, like the second metal, an alkali metal or alkaline earth metal, the third metal of course may also have a property of cleaving a bond between the first metal and the fluorine in the fluoride included in the first interlayer. In this case, if the third metal were to reach the first interlayer and the second interlayer by diffusion from the sorption layer, metal that cleaves a bond between the first metal and the fluorine would increase, and there would be a risk of the balance breaking down between impurity blocking by the first interlayer and electron supplying by the second interlayer. However, even when the third metal is an alkali metal or alkaline earth metal, diffusion of the third metal is suppressed by the cathode. Further, when the cathode has a two-layer structure of the cathode thin film layer and the cathode auxiliary layer, the cathode auxiliary layer achieves a further effect of suppressing diffusion of the third metal.

Also, according to a specific example of the organic EL element pertaining to the one aspect of the present invention, the third metal is the same type of metal as the second metal.

Thus, the second interlayer and the sorption layer are made of the same metal material, and therefore the organic EL element is easily manufactured.

Here, the third metal and the second metal being "the same type of metal" means that the same metal is used as a material. For example, when the second metal is barium, the third metal is also barium. If the third metal and the second metal were said to be "the same metal", it could be misinterpreted as meaning that the third metal and the second metal are the same object, i.e., that the second metal also serves as the third metal. If the third metal and the second metal were the same object, the second interlayer and the sorption layer would become one layer, and a contradiction in the structure of the organic EL element would arise. The phrase "the same type of metal" is used in order to eliminate such a misinterpretation. Hereinafter, "the same type of metal" is used in this way.

Further, according to a specific example of the organic EL element pertaining to the one aspect of the present invention, the second metal and the third metal are barium.

Thus, the second interlayer and the sorption layer are made of barium, which is a versatile material, and therefore cost reduction is achieved.

Further, according to a specific example of the organic EL element pertaining to the one aspect of the present invention, the first metal is sodium.

Thus, the first interlayer includes sodium fluoride that has a low hygroscopicity and a low reactivity with oxygen, and therefore has an excellent property of blocking impurities. Further, sodium has a low work function and a high electron injection property, and therefore electrons are effectively supplied to the light-emitting layer.

Further, according to a specific example of the organic EL element pertaining to the one aspect of the present invention, the cathode thin film layer is made from one metal material or an alloy of a plurality of metal materials.

By using a metal material that has excellent electrical conductivity for the cathode thin film layer, the cathode thin film layer efficiently supplies the organic EL element with power and an excellent light emission efficiency is achieved. Further, metal can be processed very thin, and therefore light absorption by the cathode thin film layer is suppressed and excellent light extraction efficiency is achieved.

A method of manufacturing an organic EL element, the method pertaining to another aspect of the present invention, is a method including: forming an anode; forming a light-emitting layer above the anode; forming a first interlayer of thickness D1 on the light-emitting layer, the first interlayer including a fluoride that includes a first metal that is an alkali metal or alkaline earth metal; forming a second interlayer of thickness D2 on the first interlayer, the second interlayer including a second metal that has a property of cleaving a bond between the first metal and fluorine in the fluoride; forming a cathode on the second interlayer; and forming a sorption layer above the cathode, the sorption layer including a third metal that has a property of taking up and holding moisture and oxygen. The film thickness D1 of the first interlayer and the film thickness D2 of the second interlayer satisfy $5\% \leq D2/D1 \leq 25\%$.

Thus, the first interlayer and the second interlayer can be formed so the ratio of the thickness D2 of the second interlayer to the thickness D1 of the first interlayer is in a preferred range in terms of the balance between the property of blocking impurities from the light-emitting layer to the cathode and the property of supplying electrons from the cathode to the light-emitting layer. Therefore, an excellent light emission property is exhibited. Further, the sorption layer takes up, holds, and blocks impurities from outside, and therefore degradation of the cathode, the first interlayer, and the second interlayer by impurities can be suppressed.

Further, according to a specific example of the method of manufacturing the organic EL element pertaining to the other aspect of the present invention, the third metal is an alkali metal or an alkaline-earth metal.

The third metal is an alkali metal or alkaline earth metal that has a comparatively low work function and a high reactivity with impurities, and therefore reacts with impurities that intrude from outside and works to capture impurities within the sorption layer. The sorption layer that includes the third metal is formed above the cathode, and this blocks intrusion of impurities to the cathode from outside to suppress degradation of the cathode, and maintains excellent light emission properties.

Further, according to a specific example of the method of manufacturing the organic EL element pertaining to the other aspect of the present invention, the thickness D1 is from 1 nm to 10 nm.

Thus, the first interlayer is formed to have a thickness that can ensure a property of sufficiently blocking impurities while preventing degradation of the electron injection property due to an excessively large value, achieving an excellent light emission property.

Further, according to a specific example of the method of manufacturing the organic EL element pertaining to the other aspect of the present invention, the thickness D2 is from 0.2 nm to 1 nm.

Thus, the second interlayer can be formed to have a thickness that exhibits a preferable electron injection property for injecting electrons, of an amount neither too large nor too small, to the light-emitting layer. This exhibits an excellent light emission efficiency.

Further, according to a specific example of the method of manufacturing the organic EL element pertaining to the other aspect of the present invention, the thickness D1 is from 5 nm to 12 nm.

The sorption layer includes the third metal, and therefore would absorb light if too thick, which would prevent efficient extraction of light emitted from the light-emitting layer. Accordingly, the sorption layer is formed to have a thickness that sufficiently blocks impurities from outside, while limiting light absorption, and therefore degradation of the cathode is suppressed and excellent light extraction efficiency is exhibited, achieving excellent light emission properties.

According to a specific example of the method of manufacturing the organic EL element pertaining to the other aspect of the present invention, the forming of the cathode includes: (A) forming a cathode thin film layer by using a metal material; and (B) forming a cathode auxiliary layer on the cathode thin film layer, the cathode auxiliary layer having at least one of an electron transporting property and an electron injecting property.

When the cathode thin film layer is very thin, electrical resistivity of the cathode thin film layer is high. Thus, voltage supplied from the peripheral portion of the cathode thin film layer decreases in the central portion of the cathode thin film layer due to voltage drop, which can lead to uneven luminance. According to the specific example of the method of manufacturing the organic EL element pertaining to the other aspect of the present invention, the cathode auxiliary layer is formed on the cathode thin film layer and therefore current supplied to the peripheral portion of the cathode thin film layer can flow through the cathode auxiliary layer in addition to the cathode thin film layer. Thus, voltage drop in the central portion of the cathode thin film layer is reduced and occurrence of uneven luminance is suppressed.

Further, according to a specific example of the method of manufacturing the organic EL element pertaining to the other aspect of the present invention, the second metal is an alkali metal or an alkaline-earth metal.

The second metal is an alkali metal or an alkaline-earth metal, which has a comparatively low work function and a comparatively high electron supply property. Therefore, the second metal has a comparatively high reactivity with fluorine and easily cleaves the bond between the first metal and fluorine. According to the forming of the second interlayer including the second metal, electron injection is efficiently promoted from the first intermediate layer to the light-emitting layer.

Further, according to a specific example of the method of manufacturing the organic EL element pertaining to the other aspect of the present invention, the third metal has a property of cleaving a bond between the first metal and the fluorine in the fluoride included in the first interlayer.

When the third metal is, like the second metal, an alkali metal or alkaline earth metal, the third metal of course may also have a property of cleaving a bond between the first metal and the fluorine in the fluoride included in the first interlayer. In this case, if the third metal were to reach the first interlayer and the second interlayer by diffusion from the sorption layer, metal that cleaves a bond between the first metal and the fluorine would increase, and there would be a risk of the balance breaking down between impurity blocking by the first interlayer and electron supplying by the second interlayer. However, even when the third metal is an alkali metal or alkaline earth metal, the cathode is formed between the sorption layer and the first interlayer and the second interlayer, and therefore diffusion of the third metal is suppressed by the cathode. Further, when forming the cathode includes the steps of forming the cathode thin film layer and forming the cathode auxiliary layer on the cathode thin film layer, the cathode auxiliary layer achieves an effect of further suppressing diffusion of the third metal.

Further, according to a specific example of the method of manufacturing the organic EL element pertaining to the other aspect of the present invention, the third metal is the same type of metal as the second metal.

Thus, the second interlayer and the sorption layer are made of the same metal material, and therefore the organic EL element is easily manufactured.

Further, according to a specific example of the method of manufacturing the organic EL element pertaining to the other aspect of the present invention, the second metal and the third metal are barium.

Thus, the second interlayer and the sorption layer are made of barium, which is a versatile material, and therefore cost reduction is achieved.

Further, according to a specific example of the method of manufacturing the organic EL element pertaining to the other aspect of the present invention, the first metal is sodium.

Thus, the first interlayer is formed including sodium fluoride that has a low hygroscopicity and a low reactivity with oxygen, and therefore has an excellent property of blocking impurities. Further, the first interlayer is formed including sodium as the first metal, which has a low work function and a high electron injection property, and therefore electrons are effectively supplied to the light-emitting layer.

Further, according to a specific example of the method of manufacturing the organic EL element pertaining to the other aspect of the present invention, the cathode thin film layer is made from one metal material or an alloy of a plurality of metal materials.

By forming the cathode thin film layer by using a metal material that has excellent electrical conductivity, the cathode thin film layer efficiently supplies the organic EL element with power and an excellent light emission efficiency is achieved. Further, metal can be processed very thin, and therefore the cathode thin film layer is formed with a very thin thickness, and therefore light absorption by the cathode thin film layer is suppressed and excellent light extraction efficiency is achieved.

The following explains structures and effects of the present invention with specific examples.

Note that an embodiment in the following explanation is just an example for simply explaining the structures and effects pertaining to one aspect of the present invention. The present invention is not limited to the embodiment except for parts considered essential to the present invention.

<Embodiment>

[1. Structure of Organic EL Element]

The following describes a structure of an organic EL element pertaining to an embodiment as one aspect of the present invention, with reference to FIG. 1.

FIG. 1 is a partially enlarged cross-sectional view showing an organic EL display panel 100 (see FIG. 12) that includes a plurality of organic EL elements 1 pertaining to the present embodiment, specifically showing a cross-section of a portion corresponding to one organic EL element 1 and the vicinity thereof. According to the present embodiment, one organic EL element 1 corresponds to one pixel (sub-pixel). The organic EL element 1 is a so-called top-emission type that has a display surface oriented towards the upper side of the drawing in FIG. 1.

As shown in FIG. 1, the organic EL element 1 includes a substrate 11, an interlayer insulating layer 12, an anode 13, a bank layer 14, a hole injection layer 15, a hole transport layer 16, a light-emitting layer 17, a first interlayer 18, a second interlayer 19, a cathode thin film layer 21, an auxiliary cathode layer 22, a sorption layer 24, and a sealing layer 25. The first interlayer 18 and the second interlayer 19 constitute an interlayer 20. The cathode thin film layer 21 and the auxiliary cathode layer 22 constitute a cathode 23.

The substrate 11, the interlayer insulating layer 12, the first interlayer 18, the second interlayer 19, the cathode thin film layer 21, the auxiliary cathode layer 22, the sorption layer 24, and the sealing layer 25 are formed not for each of the pixels, but to be common to the plurality of the organic EL elements 1 included in the organic EL display panel 100.

<Substrate>

The substrate 11 includes a base material 111 that is an insulating material and a thin film transistor (TFT) layer 112. The TFT layer 112 includes a drive circuit for each pixel. The base material 111 may be made from glass, for example. As a glass material, specific examples are alkali-free glass, soda glass, non-fluorescent glass, phosphoric acid-based glass, boric acid-based glass, and quartz.

<Interlayer Insulating Layer>

The interlayer insulating layer 12 is formed on the substrate 11. The interlayer insulating layer 12 is provided in order to planarize unevenness of an upper surface of the TFT layer 112. The interlayer insulating layer 12 is made of a resin material such as a positive photosensitive material. As such a photosensitive resin material, acrylic resin, polyimide resin, siloxane resin, or phenol resin may be used. Also, although not shown in the cross-section of FIG. 1, the interlayer insulating layer 12 has a contact hole formed therein for each of the pixels.

<Anode>

The anode 13 is made of an electrically-conductive material, formed on the interlayer insulating layer 12. The anode 13 is a pixel electrode, and for each pixel there is one anode 13. The anode 13 is electrically connected to the TFT layer 112 via a contact hole. According to the present embodiment, a top-emission type is described, and therefore the anode 13 should be made of a light-reflective electrically-conductive material. The light-reflective electrically-conductive material is a metal, for example. Specific examples of such a metal include silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), and alloy of nickel and chromium (NiCr).

In the case of a bottom-emission type, the anode 13 should be made of a light-transmissive material. A light-transmissive electrically-conductive material is indium tin oxide (ITO), indium zinc oxide (IZO), or zinc oxide (ZnO), for example.

<Bank Layer>

The bank layer 14 is formed on the anode 13 so as to expose a partial region of an upper surface of the anode 13 and cover a peripheral region surrounding the partial region. The partial region of the upper surface of the anode 13 that is not covered with the bank layer 14 (hereinafter referred to as an "opening") corresponds to a subpixel. In other words, the bank layer 14 has an opening 14a that is provided for each subpixel.

According to the present embodiment, at a part where the anode 13 is not formed, the bank layer 14 is formed on the interlayer insulating layer 12. In other words, at a part where the anode 13 is not formed, a bottom surface of the bank layer 14 is in contact with an upper surface of the interlayer insulating layer 12.

The bank layer 14 is made, for example, of an insulating organic material. Examples of an insulating organic resin include acrylic resin, polyimide resin, novolac resin, and phenol resin. In the case where the light-emitting layer 17 is formed using an application method, the bank layer 14 functions as a structure for preventing overflow of an applied ink. In the case where the light-emitting layer 17 is formed using a vapor deposition method, the bank layer 14 functions as a structure for placing a vapor deposition mask. According to the present embodiment, the bank layer 14 is made of a resin material such as a positive photosensitive resin material. Such a photosensitive resin material is acrylic resin, polyimide resin, siloxane resin, or phenol resin. According to the present embodiment, phenol resin is used.

<Hole Injection Layer>

The hole injection layer 15 is provided on the anode 13 within the opening 14a in order to promote injection of holes from the anode 13 to the light-emitting layer 17. The hole injection layer 15 is made, for example, of an oxide of a metal such as silver (Ag), molybdenum (Mo), chromium (Cr), vanadium (V), tungsten (W), nickel (Ni), or iridium (Ir), or an electrically-conductive polymer material such as poly(3,4-ethylenedioxythiophene) polystyrene sulfonate (PEDOT:PSS). The hole injection layer 15 made from such a metal oxide has a function of assisting generation of holes and stably injecting the holes to the light-emitting layer 17, and has a high work function. According to the present embodiment, the hole injection layer 15 is made of a conductive polymer material such as PEDOT:PSS.

Here, in the case where the hole injection layer 15 is made of an oxide of a transition metal, the hole injection layer 15 has a plurality of energy levels because oxides of transition metals have a plurality of oxidation numbers. This facilitates hole injection, and therefore reduces driving voltage.

<Hole Transport Layer>

The hole transport layer 16 is formed in the opening 14a. The hole transport layer 16 may be formed using, for example, polyfluorene, a polyfluorene derivative, polyarylamine, or a polyarylamine derivative.

The hole transport layer 16 has a function of transporting holes that are injected by the hole injection layer 15 to the light-emitting layer 17.

<Light-emitting Layer>

The light-emitting layer 17 is formed in the opening 14a. The light-emitting layer 17 has a function of emitting light of one of red (R), green (G), and blue (B) colors, due to recombination of holes and electrons. The light-emitting layer 17 is made of a known material. The known material is for example one of an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2,2'-bipyridine compound, complex of a Schiff base and group III metal, oxine metal complex, fluorescent substance such as rare earth complex, or phosphor substance such as a metal complex emitting phosphor light such as tris(2-phenylpyridine) iridium.

<First Interlayer>

The first interlayer 18 is formed on the light-emitting layer 17. The first interlayer 18 is intended to prevent impurities that exist within or on surfaces of the light-emitting layer 17, the hole transport layer 16, the hole injection layer 15, and the bank layer 14 from intruding into the first interlayer 18, the second interlayer 19, and the cathode thin film layer 21. Accordingly, the first interlayer 18 includes a material having a property of blocking impurities, such as an alkali metal fluoride or alkaline-earth metal fluoride. More specifically, according to the present embodiment, sodium fluoride (NaF) is used as the material included in the first interlayer 18. An alkali metal in alkali metal fluoride or an alkaline-earth metal in alkaline-earth metal fluoride included in the first interlayer 18 is hereinafter referred to as a first metal.

The first interlayer 18 has a thickness D1 nm.

<Second Interlayer>

The second interlayer 19 is formed on the first interlayer 18. The second interlayer 19 includes a metal that cleaves a bond between the first metal and fluorine in the fluoride of the first metal included in the first interlayer 18. This metal is hereinafter referred to as a second metal. The second metal, which cleaves the bond between the first metal and fluorine, is for example an alkali metal or an alkaline-earth metal. According to the present embodiment, the second metal is barium (Ba).

The second interlayer 19 has a thickness D2 nm.

<Interlayer>

The first interlayer 18 and the second interlayer 19 constitute an interlayer 20.

When the second metal included in the second intermediate layer 19 cleaves the bond between the first metal and the fluorine of the fluoride included in the first intermediate layer 18, and the first metal is an alkali metal or alkaline earth metal having a low work function and high electron injectivity, electrons can be effectively supplied to the light-emitting layer 17.

<Cathode Thin Film Layer>

The cathode thin film layer 21 is common to all sub-pixels, and is a thin film of a material composed of a metal oxide that has electrical conductivity such as indium tin oxide (ITO) or indium zinc oxide (IZO), a thin film of a metal such as aluminium, magnesium, or silver, or a thin film of an alloy of such a metal. According to the present embodiment, the cathode thin film layer 21 is an aluminium thin film.

<Cathode Auxiliary Layer>

The cathode auxiliary layer 22 is common to all sub-pixels and is formed on the cathode thin film layer 21 using an organic material that has electron transport properties. The cathode auxiliary layer 22 serves to assist the cathode function of the cathode thin film layer 21 as follows. Thickness of the cathode thin film layer 21 is very thin, and electrical resistivity is high. Thus, voltage supplied from wiring connected to a peripheral portion of the cathode thin film layer 21 is lower in a central portion of the cathode thin film layer 21 due to a voltage drop, and this may lead to uneven luminance. Here, when thickness of the cathode thin film layer 21 is thicker, light does not easily pass through metal and therefore light transmission decreases and light extraction efficiency decreases. Thus, the cathode auxiliary layer 22 is formed on the cathode thin film layer 21, power supply from the peripheral portion to the central portion of the cathode thin film layer is assisted by the cathode auxiliary layer 22, and this suppresses the voltage drop at the central portion of the cathode thin film layer 21, suppressing luminance unevenness, and suppressing a decrease in light extraction efficiency.

The cathode auxiliary layer 22, according to the present embodiment, is formed by an organic material that is the same as is typically used in an electron transport layer. The organic material of the cathode auxiliary layer 22 is, for example, a π-electron low molecular organic material such as oxadiazole derivative (OXD), triazole derivative (TAZ), or phenanthroline derivative (BCP, Bphen).

<Cathode Layer>

According to the present embodiment, the cathode thin film layer 21 and the cathode auxiliary layer 22 constitute the cathode 23.

<Sorption Layer>

The sorption layer 24 is formed on the cathode auxiliary layer 22 and has a function of taking up and holding impurities (moisture, oxygen) from outside, and serves to suppress deterioration of the cathode thin film layer 21 caused by impurities that intrude from outside and reach the cathode thin film layer 21. The sorption layer 24 includes a third metal for taking up and holding moisture and oxygen. As the third metal, an alkali metal or alkaline earth metal is used. More specifically, a low work function metal is used such as lithium, barium, calcium, potassium, cesium, sodium, or rubidium. According to the present embodiment, the third metal is barium (Ba) and the sorption layer 24 is a single layer of barium. In particular, when the cathode thin film layer 21 is a metal thin film as in the present embodiment, metal is easily oxidized and degraded by moisture and oxygen, and therefore the effect of the sorption layer 24 is large.

Here, "sorption" of an impurity means that the third metal reacts with the impurity to oxidize, or similar, and due to the impurity being captured in the oxide molecule the impurity is prevented from passing though the sorption layer 24 and arriving at the cathode thin film layer 21 of the cathode 23. Accordingly, the "sorption layer" has a function of preventing transmission and diffusion of impurities.

The sorption layer 24 may be an organic film doped with the third metal. In this case, the material that has an electron transporting property that is used in the cathode auxiliary layer 22 may be used in the organic film.

Further, the sorption layer 24 has a thickness D3 nm.

<Sealing Layer>

On the sorption layer 24 may be disposed the sealing layer 25, which is for suppressing intrusion of moisture and oxygen from outside. As a material of the sealing layer 25, a light-transmissive material is selected such as silicon nitride (SiN) or silicon oxynitride (SiON).

<Other>

Although not illustrated in FIG. 1, a color filter and an upper substrate may be adhered onto the sealing layer 25. Mounting and bonding of the upper substrate further protects from moisture and oxygen.

[2. Property of Blocking Impurities and Electron Injection Property]

In the case in which the hole injection layer 15, the hole transport layer 16, and the light-emitting layer 17 are formed by wet processes, when impurities that exist within or on surfaces of these layers reach the interlayer 20 or the cathode thin film layer 21, the impurities react with the metal of the cathode thin film layer 21 or the interlayer 20 and this degrades electron injection to the light-emitting layer 17. Also in the case in which the bank layer 14 is formed by a wet process, impurities within or on the surface of the bank layer 14 may cause a problem such as described above.

In view of this, the organic EL element 1 pertaining to the present invention includes the first interlayer 18 and the second interlayer 19 between the light-emitting layer 17 and the cathode thin film layer 21. The first interlayer 18 includes NaF. NaF has an excellent property of blocking impurities because of having a lower reactivity with oxygen than an alkali metal or alkaline-earth metal. Accordingly, the first interlayer 18 prevents intrusion of the impurities from the light-emitting layer 17. Further, in the case of the cathode thin film layer 21 being made of a metal such as Al or MgAg, degradation of the cathode thin film layer 21 due to impurities can be prevented.

On the other hand, NaF has a high electron insulating property, and this causes a problem that NaF blocks movement of electrons, which are supplied from the cathode thin film layer 21 to the light-emitting layer 17, and as a result degrades light emission properties.

In view of this, the organic EL element 1 pertaining to the present invention includes the second interlayer 19 between the first interlayer 18 and the cathode thin film layer 21. The second interlayer 19 includes Ba as the second metal. Ba cleaves the bond between Na and fluorine (F) in the fluoride of Na (NaF), which is the fluoride of the first metal included in the first interlayer 18. Accordingly, part of NaF in the first interlayer 18 may dissociate. When a portion of NaF dissociates and Na is liberated, Na has a low work function and a high electron supply property, and accordingly assists movement of electrons from the cathode thin film layer 21 to the light-emitting layer 17. This suppresses degradation of light emission properties. Also, NaF in the first interlayer 18 exhibits a further excellent property of blocking impurities. Thus, the Ba forming the second interlayer 19 is not degraded, reacts with the NaF forming the first interlayer, and effectively cleaves the bonds between Na and F.

Note that the mechanism that cleaves the bond between the first metal and the fluorine in the fluoride of the first metal is not limited to the above. Any mechanism may cleave the bond between the first metal and the fluorine unless the mechanism impairs the functions of the first interlayer 18, the second interlayer 19, the light-emitting layer 17, and the cathode thin film layer 21, and so on.

As described above, the first interlayer 18 includes the fluoride of the first metal, which has a high property of blocking impurities, and accordingly prevents intrusion of impurities from the light-emitting layer 17, and suppresses degradation of the electron supply property of the cathode thin film layer 21 (and the second interlayer 19). Also, the second interlayer 19 includes the second metal, which cleaves the bond between the first metal and the fluorine. Accordingly, the first metal is liberated, and this facilitates movement of electrons from the cathode thin film layer 21 to the light-emitting layer 17 through the first interlayer 18, which has a high insulating property. As a result, an excellent light emission efficiency is exhibited.

Note that a case may occur in which the actual boundary between the first interlayer 18 and the second interlayer 19 is not clearly defined, and the material included in the first interlayer 18 and the material included in the second interlayer 19 are mixed together to a certain degree during the manufacturing process thereof. That is, the first interlayer 18 and the second interlayer 19 do not necessarily have the precise thicknesses D1 and D2, respectively, and the boundary therebetween is sometimes unclear. Even in this case, concentration of the first metal in the interlayer 20 is higher on the side of the light-emitting layer 17 than on the side of the cathode thin film layer 21, and concentration of the second metal in the interlayer 20 is higher on the side of the functional layer 21 than on the side of the light-emitting layer 17.

Here, in the case in which the first interlayer 18 and the second interlayer 19 are formed by methods intended to form the first interlayer 18 and the second interlayer 19 to have the thicknesses D1 and D2, respectively, the first interlayer 18 and second interlayer 19 are regarded as having the thicknesses D1 and D2, respectively. This also applies to thicknesses of other layers. This also applies to modifications.

[3. Effects of Second Interlayer]

Figure 2:
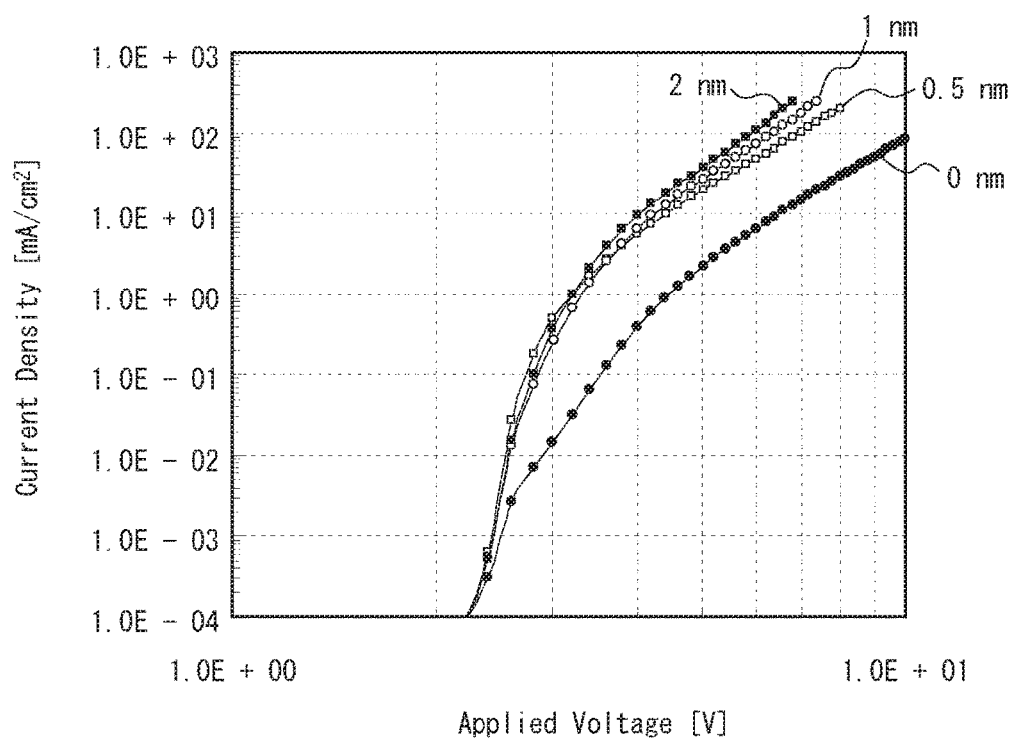
FIG. 2 is a graph showing changes in current density according to differences in thickness of second interlayer.

FIG. 2 is a graph showing results of measurement of current density by applying voltage to each of four specimens of the organic EL display panel 100. The four specimens differ from each other in the thickness D2 of the second interlayer 19. The four specimens include the second interlayer 19 having the thicknesses D2 of 0 nm, 0.5 nm, 1 nm, and 2 nm. The current density was measured with respect to cells (different organic EL elements 1) included in each of the specimens by varying an application voltage. Aside from the differences in the thickness D2 of the second interlayer 19, thicknesses of other layers are the same for all four of the specimens and the thickness D1 of the first interlayer 18 is 4 nm.

As shown in FIG. 2, compared with the specimen including the second interlayer 19 having the thickness D2 of 0 nm (that is, the specimen not including the second interlayer 19), a high current density was observed with respect to the specimens including the second interlayer 19 having the thickness D2 of 0.5 nm, 1 nm, and 2 nm. The results demonstrate that provision of the second interlayer 19 supplies a higher current to the organic EL element 1. Accordingly, provision of the second interlayer 19 supplies a higher current to the light-emitting layer 17, and thereby an effect is exhibited of an improved luminance of the organic EL element 1.

[4. Thickness of Second Interlayer and Light Emission Efficiency Ratio]

Figure 3:
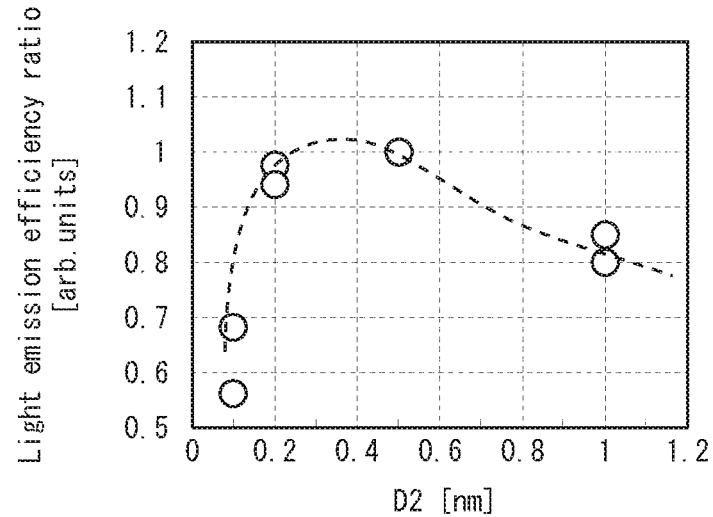
FIG. 3 is a graph showing changes in light emission efficiency ratio according to differences in thickness of the second interlayer.

FIG. 3 is a graph showing light emission efficiency ratio with respect to specimens of the organic EL display panel 100 that differ from each other in the thickness D2 of the second interlayer 19. The four specimens include the second interlayer 19 having the thicknesses D2 of 0.1 nm, 0.2 nm, 0.5 nm, and 1 nm. With respect to each of the four specimens including the second interlayer 19 having different thicknesses, luminance was measured by applying voltage to the specimen such that current density was 10 mA/$cm^2$, and light emission efficiency was calculated from the measured luminance. Then, a ratio of the light emission efficiency to a reference value for light emission efficiency of the organic EL display panel (light emission efficiency ratio) was calculated and plotted on the graph, which is FIG. 3.

Aside from the differences in the thickness D2 of the second interlayer 19, thicknesses of other layers are the same for all four of the specimens of the organic EL display panel and the thickness D1 of the first interlayer 18 is 4 nm.

As shown in FIG. 3, the highest light emission efficiency ratio was observed with respect to the specimen including the second interlayer 19 having the thickness D2 of 0.5 nm. The specimen having the thickness D2 of 1 nm had a lower light emission efficiency ratio than the specimen having the thickness D2 of 0.5 nm. This is because of the following reason. A constant amount of holes are injected from the hole transport layer 16 to the light-emitting layer 17. Accordingly, even if an amount of electrons that is excessively high relative to the constant amount of holes is injected to the light-emitting layer 17 and thereby the current increases, the luminance does not increase. As a result, the light emission efficiency decreased, and the light emission efficiency ratio also decreased.

As shown in FIG. 3, when the light emission efficiency ratio of the specimen having the thickness D2 of 0.5 nm, which exhibited the highest light emission efficiency, is taken as a reference, maintaining a light emission efficiency ratio of at least 80% of the reference is preferred. Accordingly, 0.2 nm≤D2≤1 nm is a range of effective values for the thickness D2.

[5. Thickness of First Interlayer and Light Emission Efficiency Ratio]

Figure 4:
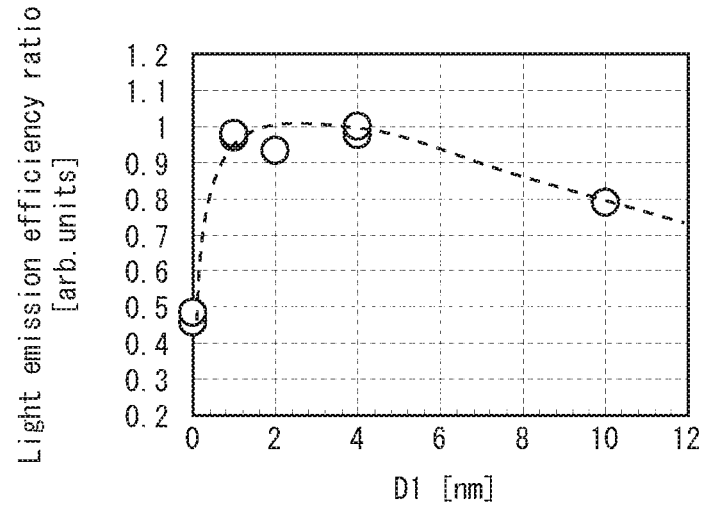
FIG. 4 is a graph showing changes in light emission efficiency ratio according to differences in thickness of first interlayer.

FIG. 4 is a graph showing light emission efficiency ratio with respect to five specimens of the organic EL display panel 100. The five specimens differ from each other in the thickness D1 of the first interlayer 18. The thicknesses D1 of the first interlayer 18 are 0 nm, 1 nm, 2 nm, 4 nm, and 10 nm. The five specimens of the organic EL panel each include the second interlayer 19 having the thickness D2 of 0.5 nm.

The light emission efficiency ratio was calculated in the same way as the light emission efficiency ratio for FIG. 3. That is, luminance was measured by applying voltage such that current density was 10 mA/$cm^2$, and light emission efficiency was calculated from the measured luminance. Then, a ratio of the calculated light emission efficiency to a reference value for light emission efficiency of the organic EL display panel (light emission efficiency ratio) was calculated. Finally, the calculated values were plotted on a graph, shown in FIG. 4.

As shown in FIG. 4, among the five specimens, the specimen having the thickness D1 of 0 nm, i.e., the specimen not including the first interlayer 18, showed a very low light emission efficiency ratio. This is thought to be because impurities from the light-emitting layer were not blocked and the second interlayer 19 or the cathode thin film layer 21 degraded, and therefore the supply of electrons to the light-emitting layer 17 was insufficient.

Further, the highest light emission efficiency ratio was observed with respect to the thickness D1 of 4 nm. Substantially the same light emission efficiency ratio was observed with respect to the thickness D1 of 1 nm and 2 nm. However, although the specimen having the thickness D1 of 10 nm kept a relatively high light emission efficiency, light emission efficiency can be seen to trend downwards as thickness D1 increases beyond 4 nm. When the thickness D1 of the first interlayer 18 is excessively large, the property of the first interlayer 18 as an insulating film increases. This is thought to decrease electron injection to the light-emitting layer 17. Accordingly, the effective range for the thickness D1 of the first interlayer 18 is from 1 nm to 10 nm.

[6. Thickness Ratio of Second Interlayer to First Interlayer and Light Emission Efficiency Ratio]

As described above, the thickness D1 of the first interlayer 18 needs to have the minimum value for exhibiting the property of blocking impurities. On the other hand, in the case where the thickness D1 is excessively large, the property of the first interlayer 18 as an insulating layer increases. This interferes with injection of electrons to the light-emitting layer 17, and as a result sufficient luminance is not exhibited.

Also, in the case where the thickness D2 is excessively small, the second metal (Ba in the present embodiment), which is included in the second interlayer 19, cannot sufficiently liberate the first metal (Na in the present embodiment) that is included in the first interlayer 18. As a result, sufficient electrons cannot be supplied to the light-emitting layer 17. On the other hand, in the case where the thickness D2 is excessively large, an amount of electrons that is excessively high relative to an amount of holes is supplied to the light-emitting layer 17. This degrades the light emission efficiency.

Further, in the case of the second interlayer 19 having the thickness D2 that is excessively large relative to the thickness D1 of the first interlayer 18, the second metal excessively liberates the first metal, and fluoride of the first metal reduces. As a result, there is a risk of the property of blocking impurities of the first interlayer 18 not being sufficient.

From the above results, the inventors supposed that there is not only a preferable range of values for the thicknesses of the first interlayer 18 and the second interlayer 19, but there is also a preferable range of values for D2/D1. Thus, the inventors investigated how light emission efficiency ratios varies as D2/D1 varies. Results are shown in FIG. 5.

Figure 5:
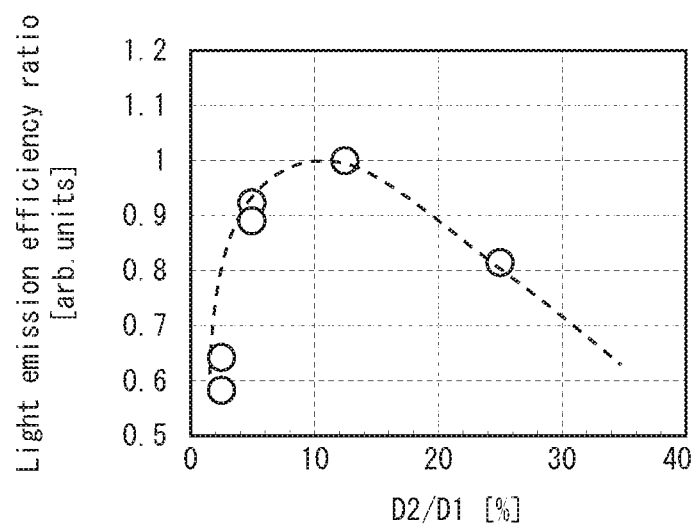
FIG. 5 is a graph showing changes in light emission efficiency ratio according to differences in a ratio of thickness of the second interlayer to the first interlayer.

FIG. 5 is a graph in which light emission efficiency ratio is plotted with respect to four specimens that have the thickness ratios D2/D1 of 2.5%, 5%, 12.5%, and 25%, respectively. As shown in FIG. 5, when the thickness ratio D2/D1 is 12.5%, the greatest light emission efficiency ratio was observed. Further, at the thickness ratio D2/D1 of 5%, a light emission efficiency substantially the same as that of the thickness ratio D2/D1 of 12.5% was observed, but when the thickness ratio D2/D1 was 2.5%, the light emission efficiency ratio rapidly dropped off. Although the light emission efficiency ratio at the thickness ratio D2/D1 of 25% is lower than that of the thickness ratio D2/D1 of 5%, when the highest value of the thickness ratio D2/D1 of 12.5% is taken as a reference value for light emission efficiency ratio, the thickness ratio D2/D1 of 25% indicates a relatively good light emission efficiency ratio that is at least 80% of the reference value.

The results demonstrate that when the thickness ratio is 5%≤D2/D1≤25%, an excellent light emission efficiency is exhibited.

As described above, there is a case where the actual boundary between the first interlayer 18 and the second interlayer 19 is not clearly defined, and material included in the first interlayer 18 and material included in the second interlayer 19 are mixed together to a certain degree during the manufacturing process. In such a case, an excellent luminous efficiency is exhibited when a component ratio (mole ratio) of the second metal to the first metal in the interlayer 20 is from 2% to 10%.

[7. Thickness of Sorption Layer and Light Emission Efficiency Ratio]

Figure 6A:
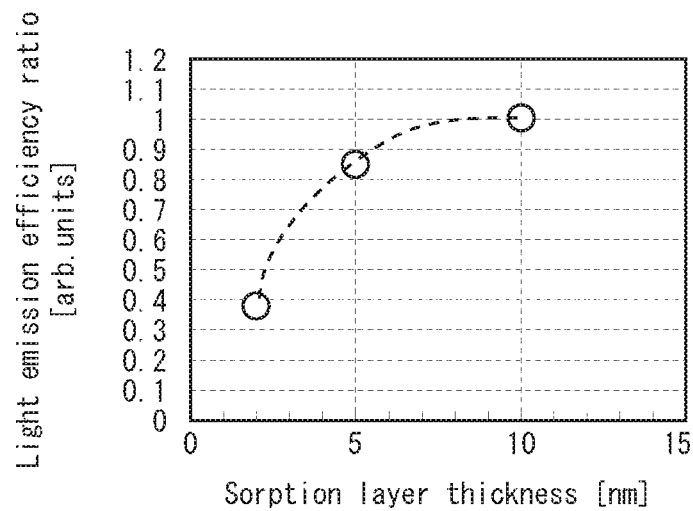
FIG. 6A is a graph showing changes in light emission efficiency ratio according to differences in thickness of sorption layer.

FIG. 6A is a graph showing luminous efficiency ratio with respect to three specimens of the organic EL display panel 100. The three specimens differ from each other in the thickness D3 of the sorption layer 24 (according to the present embodiment, a Ba layer). The three specimens have the thicknesses D3 of 2 nm, 5 nm, and 10 nm, respectively. The light emission efficiency ratio was calculated in the same way as the light emission efficiency ratio for FIG. 3. That is, luminance was measured by applying voltage such that current density was 10 mA/cm$^2$, and light emission efficiency was calculated from the measured luminance. Then, a ratio of the calculated light emission efficiency to a reference value for light emission efficiency of the organic EL display panel (light emission efficiency ratio) was calculated. Thus, the calculated value was plotted on a graph, which is shown in FIG. 6A. The specimens each include the first interlayer 18 having the thickness D1 of 4 nm and the second interlayer 19 having the thickness D2 of 0.5 nm.

As shown in FIG. 6A, the highest light emission efficiency ratio was observed with respect to the specimen including the sorption layer 24 having the thickness D3 of 10 nm. Although lower than when the thickness D3 was 10 nm, the specimen having the thickness D3 of 5 nm exhibited a relatively high light emission efficiency ratio.

However, the specimen having the thickness D3 of 2 nm exhibited a very low light emission efficiency ratio. This is considered to be because, when the sorption layer 24 is thin, impurities from outside are insufficiently taken up, moisture and oxygen that is not taken up degrades the cathode thin film layer 21 (and the second interlayer 19), and therefore electrons are insufficiently supplied to the light-emitting layer 17. Accordingly, from the graph in FIG. 6A, it can be said that as long as the sorption layer 24 has the thickness D3 of at least 5 nm, an excellent light emission efficiency is exhibited.

Figure 6B:
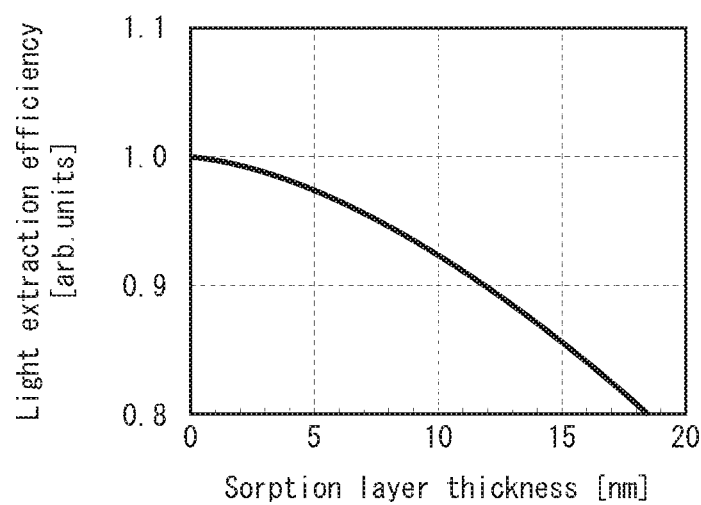
FIG. 6B is a graph showing changes in light extraction efficiency according to differences in thickness of the sorption layer.

On the other hand, when the sorption layer 24 is thick, light transmittance of the sorption layer 24 decreases, and light extraction efficiency of the organic EL element 1 decreases. FIG. 6B shows results of an optical simulation of changes in light extraction efficiency according to differences in the thickness D3 of the sorption layer 24. As shown in FIG. 6B, as the thickness D3 increases, light extraction efficiency decreases, and when light extraction efficiency is considered to be 1.0 without the sorption layer 24 (D3 is 0 nm), light extraction efficiency is 0.9 when the thickness D3 of the sorption layer 24 is 12 nm. A light extraction efficiency of at least 0.9 is preferable, and therefore according to the graph of FIG. 6B, the thickness D3 of the sorption layer 24 is preferably less than or equal to 12 nm.

When considered in combination with the results of light emission efficiency ratio shown in FIG. 6A, as long as the thickness D3 is from 5 nm to 12 nm, impurities that intrude from outside are taken up and held, an excellent light emission efficiency is exhibited, and an excellent light extraction efficiency is exhibited.

[8. Relationship between Sorption Layer, Cathode Auxiliary Layer, and Interlayer]

The organic EL element 1 pertaining to the embodiment has the sorption layer 24. The sorption layer 24 includes the third metal, and the third metal is an alkali metal or alkaline earth metal. Here, the third metal included in the sorption layer 24 may diffuse through the cathode thin film layer 21 and arrive at the interlayer 20. When this occurs, the second metal included in the second interlayer 19 of the interlayer 20 is also an alkali metal or alkaline earth metal, like the third metal, and therefore the third metal that diffuses from sorption layer 24 also has a function of cleaving bonds between Na and fluorine (F) in the sodium fluoride (NaF) of the first interlayer 18. Thus, the balance between the impurity blocking property of the first interlayer 18 and the NaF cleaving function by the second interlayer 19 breaks down and the NaF cleaving function increases. As a result, impurity blocking property decreases, light emission efficiency decreases, and there is a risk of this leading to a shortened lifespan. In particular, in the case of the present embodiment, Ba is used as the second metal and the third metal, and therefore such a collapse in balance could be significant.

However, in the case of the organic EL element 1 pertaining to the present embodiment, the cathode auxiliary layer 22 is provided between the sorption layer 24 and the interlayer 20, and therefore a distance between the sorption layer 24 and the interlayer 20 is increased and the time taken for the third metal to reach the interlayer 20 by diffusion increases. Thus a reduction in lifespan is suppressed.

When a high molecular organic material is used in the cathode auxiliary layer 22, density of the cathode auxiliary layer 22 increases, diffusion of the third metal becomes correspondingly difficult, and a further effect of suppressing the reduction in lifespan can be expected.

[9. Method of Manufacturing Organic EL Element]

The following explains a method of manufacturing the organic EL element 1 pertaining to the present embodiment, with reference to FIG. 7A, FIG. 7B, FIG. 7C, FIG. 8A, FIG. 8B, FIG. 8C, FIG. 9A, FIG. 9B, FIG. 9C, FIG. 10A, FIG. 10B, FIG. 10C, FIG. 10D, and FIG. 11. Drawings from FIG. 7A to FIG. 10D are cross-sectional views schematically showing a process of manufacturing the organic EL element 1, and FIG. 11 is a flow chart schematically showing the process of manufacturing the organic EL element 1.

Figure 7A:
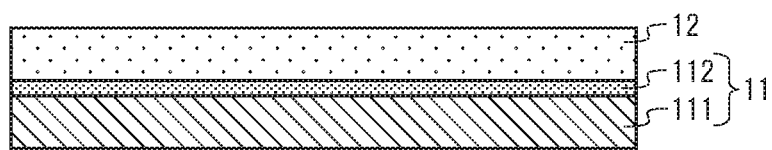
FIG. 7A, FIG. 7B, and FIG. 7C are cross-sections schematically showing a portion of a process of manufacturing an organic EL element pertaining to an embodiment of the present invention.
Figure 11:
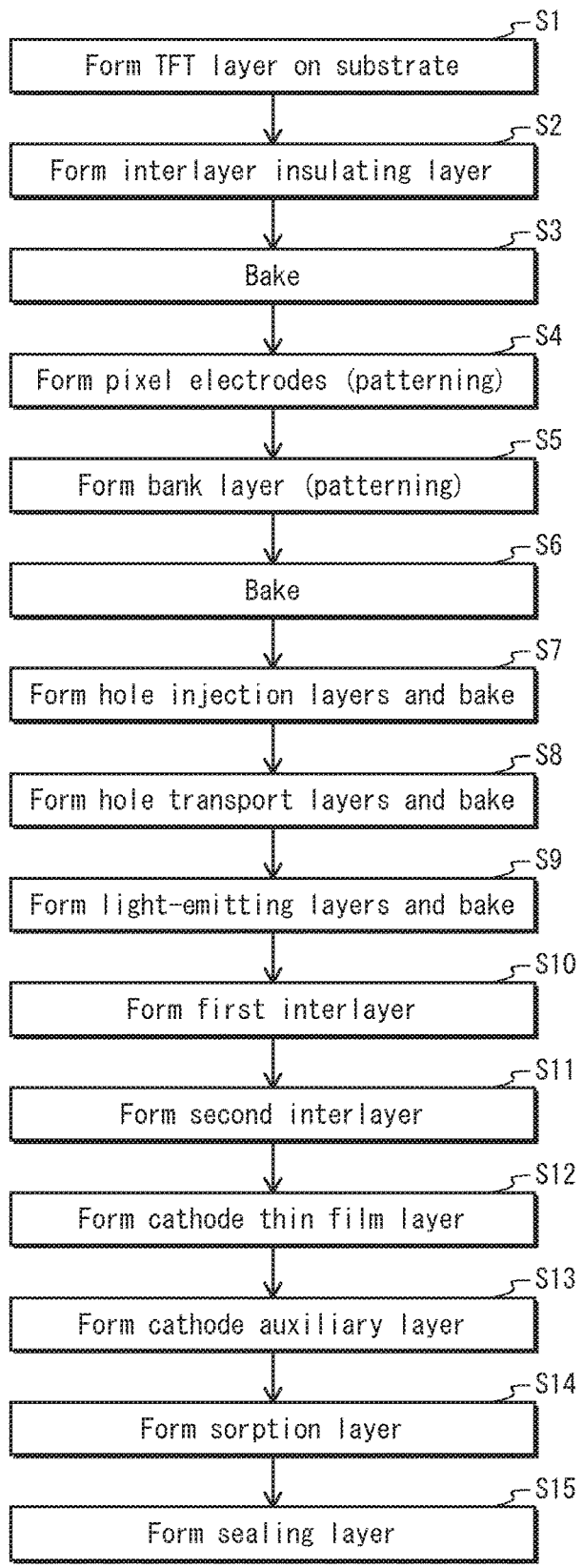
FIG. 11 is a flowchart showing the process of manufacturing the organic EL element pertaining to an embodiment of the present invention.

As shown in FIG. 7A, the substrate 11 is formed by forming the TFT layer 112 on the base material 111 (Step S1 in FIG. 11), and the interlayer insulating layer 12 is formed on the substrate 11 (Step S2 in FIG. 11). According to the present embodiment, as a resin for an interlayer insulating layer that is a material of the interlayer insulating layer 12, acrylic resin, which is a positive photosensitive material, is used. The interlayer insulating layer 12 is formed by applying an interlayer insulating layer solution onto the substrate 11, and baking (Step S3 in FIG. 11). The interlayer insulating layer solution is a solution in which acrylic resin, which is an interlayer insulating layer resin, is dissolved in an interlayer insulating layer solvent such as PGMEA. Baking is performed at a temperature from 150° C. to 210° C. for 180 minutes.

Although not shown in the cross-sectional views from FIG. 7A to FIG. 10D or the flow chart in FIG. 11, while the interlayer insulating layer 12 is formed, a contact hole is formed at a position between each of the openings 14a (regions where the openings 14a are to be formed) of the interlayer insulating layer 12. The contact hole is formed by performing pattern exposure and developing. Since the interlayer insulating layer 12 becomes solid after baking, the contact hole is formed more easily before baking the interlayer insulating layer 12 than after baking the interlayer insulating layer 12.

Figure 7B:
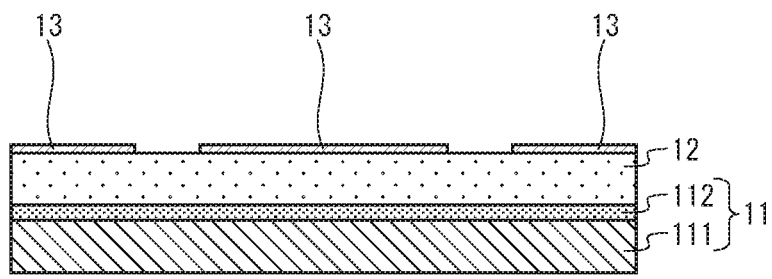

Then, as shown in FIG. 7B, the anode 13 is formed for each subpixel at a thickness of approximately 150 nm, from a metal material, using a vacuum deposition method or a sputtering method (Step S4 in FIG. 11).

Figure 7C:
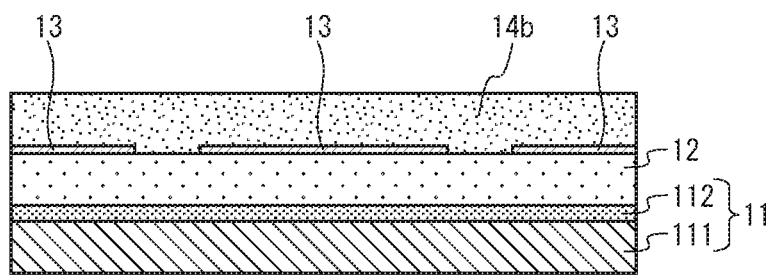

Next, a bank material layer 14b is formed by applying a bank layer resin that is a material of the bank layer 14 onto the anode 13 (FIG. 7C). As the bank layer resin, phenol resin, which is a positive photosensitive material, is used, for example. The bank material layer 14b is formed for example by uniformly applying, onto the anode 13, a solution in which phenol resin, which is the bank layer resin, is dissolved in solvent (such as mixed solvent of ethyl lactate and GBL), with use of a spin coat method or the like.

Next, the bank layer 14 is formed by performing pattern exposure and developing on the bank material layer 14b (FIG. 8A and Step S5 in FIG. 11), and the bank layer 14 is baked (Step S6 in FIG. 11). The bank layer 14 defines the opening 14a, which is a region in which the light-emitting layer 17 is to be formed. Baking of the bank layer 14 is performed for example at a temperature from 150° C. to 210° C. for 60 minutes.

In a process of forming the bank layer 14, a surface of the bank layer 14 may undergo surface processing with use of a predetermined alkaline solution, water, organic solvent, or the like, and may undergo plasma processing. Surface processing of the bank layer 14 is performed in order to adjust a contact angle of the bank layer 14 relative to ink (solution) to be applied to the opening 14a or to provide the surface of the bank layer 14 with water repellency.

Figure 8A:
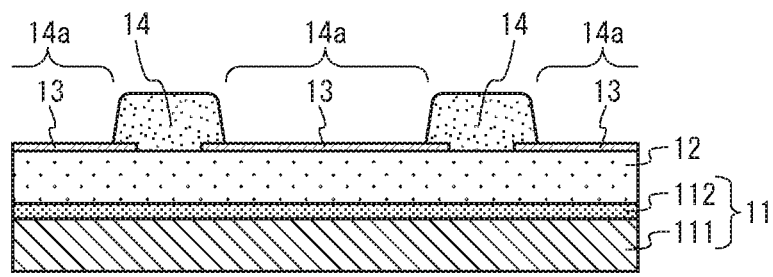
FIG. 8A, FIG. 8B, and FIG. 8C are cross-sections schematically showing a portion of the process of manufacturing the organic EL element, continued from FIG. 7C.
Figure 8B:
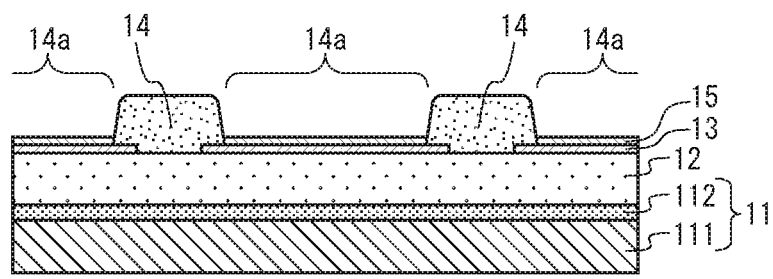

Then, as shown in FIG. 8B, the hole injection layer 15 is formed by using an application method such as a mask vapor deposition method and an inkjet method, and baking (Step S7 in FIG. 11).

Figure 8C:
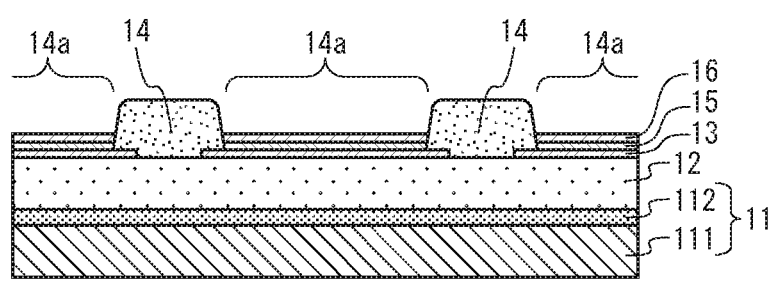

Next, as shown in FIG. 8C, the hole transport layer 16 is formed by applying ink including a material of the hole transport layer 16 to the opening 14a defined by the bank layer 14, and baking (drying) the ink (Step S8 in FIG. 11).

Figure 9A:
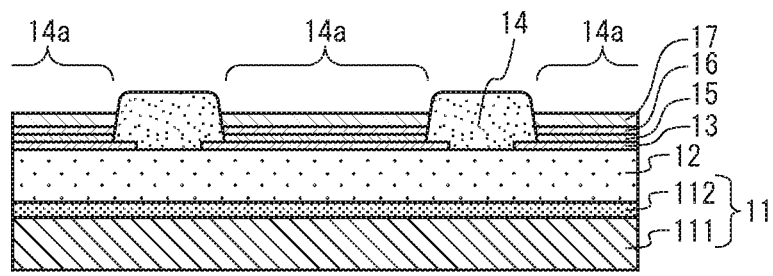
FIG. 9A, FIG. 9B, and FIG. 9C are cross-sections schematically showing a portion of the process of manufacturing the organic EL element, continued from FIG. 8C.

Similarly, as shown in FIG. 9A, the light-emitting layer 17 is formed by applying ink containing a material of the light-emitting layer 17, and baking (drying) the ink (Step S9 in FIG. 11).

Figure 9B:
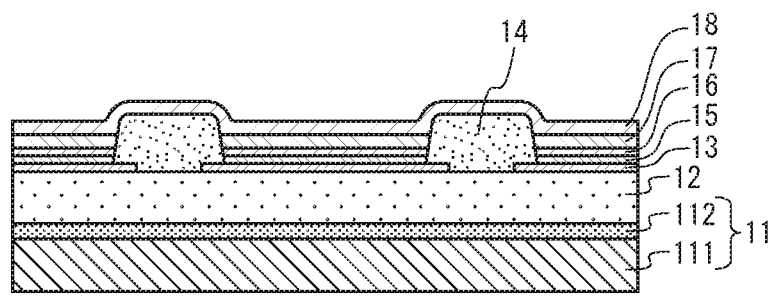

Then, as shown in FIG. 9B, the first interlayer 18 having the thickness D1 is formed on the light-emitting layer 17 and the bank layer 14 (Step S10 in FIG. 11).

Figure 9C:
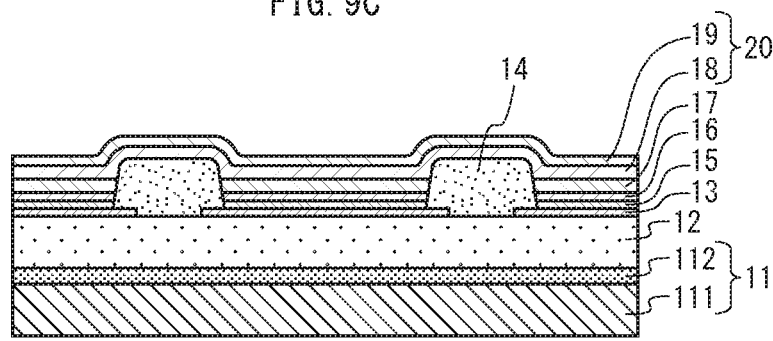

Then, as shown in FIG. 9C, the second interlayer 19 having the thickness D2 is formed on the first interlayer 18 using a vacuum deposition method or the like (Step S11 in FIG. 11). The first interlayer 18 and the second interlayer 19 constitute the interlayer 20.

Figure 10A:
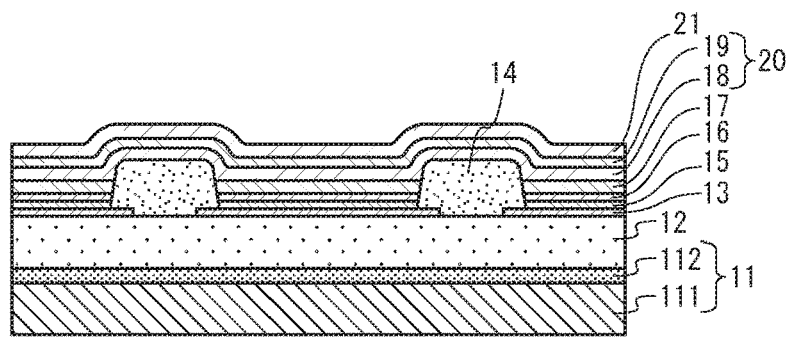
FIG. 10A, FIG. 10B, FIG. 10C, and FIG. 10D are cross-sections schematically showing a portion of the process of manufacturing the organic EL element, continued from FIG. 9C.

Next, as shown in FIG. 10A, the cathode thin film layer 21 is formed on the second interlayer 19 by vacuum deposition or sputtering of a material of the cathode thin film layer 21 (Step S12 in FIG. 11).

Figure 10B:
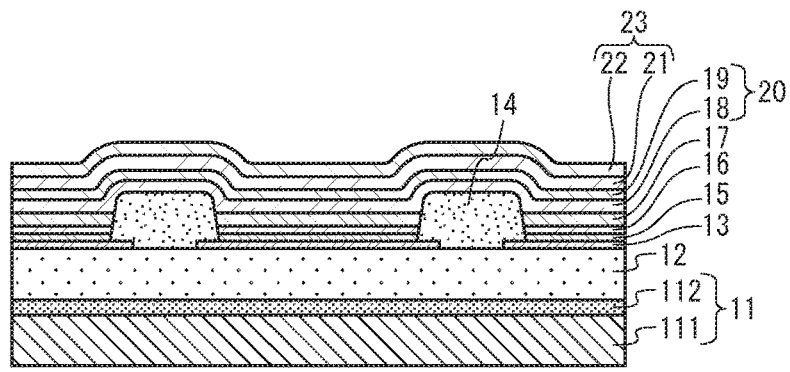

Next, as shown in FIG. 10B, the cathode auxiliary layer 22 is formed on the cathode thin film layer 21 by using vacuum deposition or sputtering of a material of the cathode auxiliary layer (Step S13 in FIG. 11). The cathode thin film layer 21 and the cathode auxiliary layer 22 constitute the cathode 23.

Figure 10C:
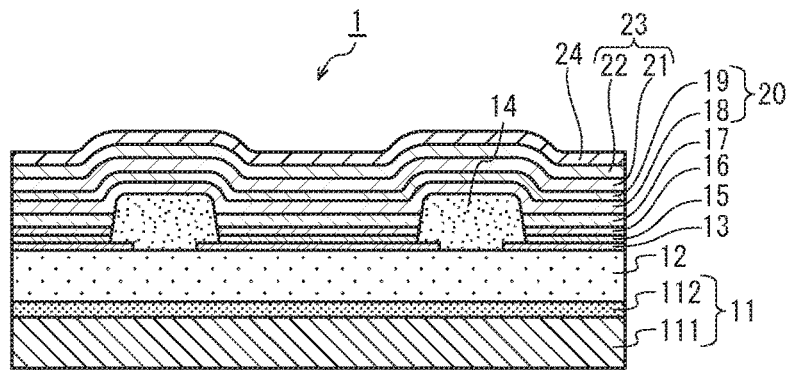

Then, as shown in FIG. 10C, the sorption layer 24 is formed on the cathode auxiliary layer 22 by using vacuum deposition or sputtering of a material of the sorption layer 24 (Step S14 in FIG. 11).

Figure 10D:
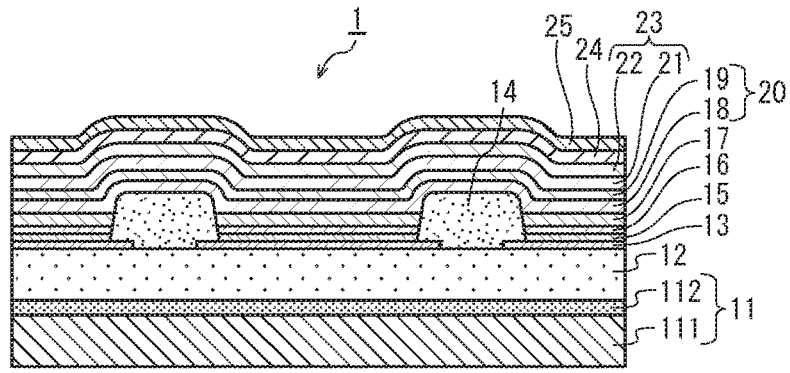

Then, as shown in FIG. 10D, the sealing layer 25 is formed on the sorption layer 24 by using sputtering or CVD of a light-transmissive material such as SiN and SiON (Step S15 in FIG. 11).

Through the above processes, the organic EL element 1 and the organic EL display panel 100 including a plurality of organic EL elements 1 are completed. A color filter, an upper substrate, and so on may be adhered onto the sealing layer 25.

[10. Overall Structure of Organic EL Display Device]

Figure 12:
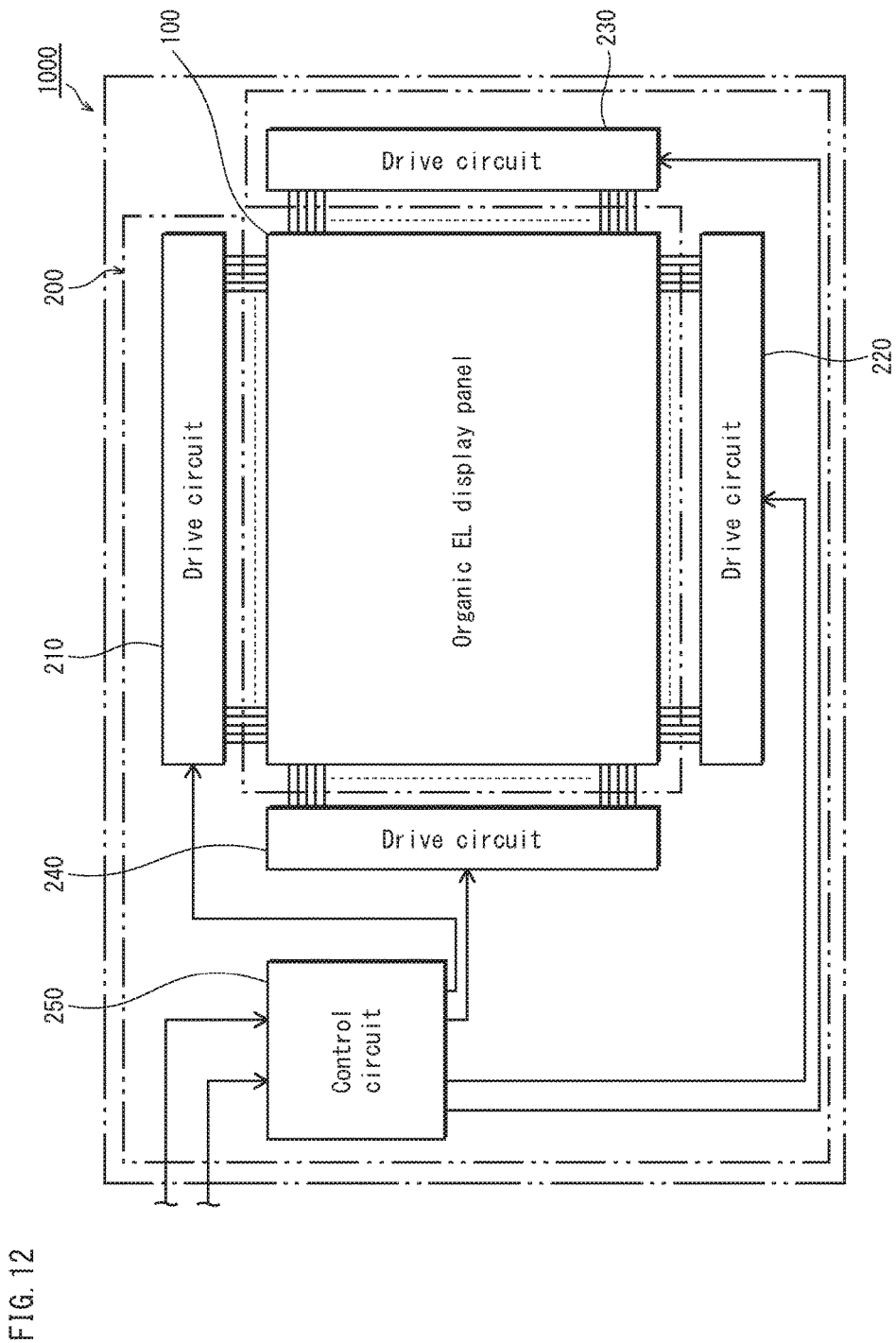
FIG. 12 is a schematic block diagram showing a structure of an organic EL display device incorporating the organic EL element pertaining to an embodiment of the present invention.

FIG. 12 is a block diagram schematically showing an organic EL display device 1000 including the organic EL display panel 100 having the organic EL elements 1. As shown in FIG. 12, the organic EL display device 1000 includes the organic EL display panel 100 and a drive control unit 200 that is connected to the organic EL display panel 100. The organic EL display panel 100 is a display panel employing the electroluminescence phenomenon of organic materials, and has the organic EL elements 1 that are arranged for example in a matrix of rows and columns. The drive control unit 200 includes four drive circuits 210 to 240 and a control circuit 250.

In the actual organic EL display device 1000, the drive control unit 200 is not limited to this arrangement relative to the organic EL display panel 100.

[Embodiment Summary]

According to the organic EL element 1 pertaining to the embodiment of the present invention described above, the first interlayer 18 prevents intrusion of impurities from the light-emitting layer 17 into the second interlayer 19 and the cathode thin film layer 21. In addition, the second interlayer 19 promotes electron injection from the cathode 23 to the light-emitting layer 17. This exhibits excellent light emission properties. Furthermore, the sorption layer 24 blocks intrusion of impurities from the sealing layer 25 to the second interlayer 19 and the cathode thin film layer 21, exhibiting excellent light-emitting properties.

Further, the thickness D1 of the first interlayer 18 and the thickness D2 of the second interlayer 19 satisfy 5%≤D2/D1≤25%. This exhibits an excellent light emission efficiency.

Moreover, since the thickness of the sorption layer 24 is 12 nm or less, a low amount of light absorbed by the sorption layer 24 is achieved and an excellent light extraction property is exhibited even in a top-emission type.

Note that the conditions for the values and the ratio of the thickness in the above explanation do not necessarily need to be satisfied with respect to the whole region of each subpixel defined by the opening 14a. The conditions for the values and the ratio of the thickness only need to be satisfied with respect to the center part of the subpixel in plan view. The conditions for the values and the ratio of the thickness need not be satisfied with respect to part of the region of the subpixel (for example, a region adjacent to the bank layer 14, or a region formed partially on the bank layer 14).

[Modifications]

Although the explanation has been given based on the embodiment of the present invention, the present invention is not limited to the embodiment. The following modifications for example may be made.

(Modification 1)

According to the above embodiment, the explanation has been given on the example in which the organic EL element 1 includes the cathode auxiliary layer 22. However, this is just an example. The organic EL element 1 may be configured without the cathode auxiliary layer 22. In this case, impurities intruding from the sealing layer 25 are taken up and held by the sorption layer 24, and therefore degradation of the cathode thin film layer 21 by impurities is suppressed more than a case in which the sorption layer 24 is not provided.

Further, even when the cathode auxiliary layer 22 is not provided, diffusion of the third metal from the sorption layer 24 is suppressed by the cathode thin film layer 21.

(Modification 2)

According to the above embodiment, an explanation has been given on the example in which the organic EL element 1 includes the hole injection layer 15 and the hole transport layer 16. However, this is just an example. Alternatively, the organic EL element 1 need not include at least one or all of these layers.

(Modification 3)

Further, an electron injection layer, an electron transport layer, a light-transmissive electrically-conductive layer, and other layers may be included.

(Modification 4)

According to the above embodiment, an explanation has been given of the example in which glass is used as the insulating material of the base material 111 in the organic EL element 1. However, this is just an example. Alternatively, resin, ceramic, or the like may be used as the insulating material of the base material 111. Examples of the resin used for the base material 111 include insulating materials such as polyimide resin, acrylic resin, styrene resin, polycarbonate resin, epoxy resin, polyethersulfone, polyethylene, polyester, and silicone resin. Examples of ceramic used for the base material 111 include aluminum.

INDUSTRIAL APPLICABILITY

The organic EL element, a method of manufacturing the organic EL element, etc., pertaining to the present invention are preferably utilizable for organic EL elements used in displays in various types of display devices for households, public facilities, and businesses, displays for television devices, portable electronic devices, and so on.

REFERENCE SIGNS LIST

1 organic EL element
13 anode
17 light-emitting layer
18 first interlayer
19 second interlayer
21 cathode thin film layer
22 cathode auxiliary layer
23 cathode
24 sorption layer

The invention claimed is:

1. An organic EL element comprising:
an anode;
a light-emitting layer disposed above the anode;
a first interlayer disposed on the light-emitting layer, the first interlayer including a fluoride that includes a first metal that is an alkali metal or alkaline earth metal;
a second interlayer disposed on the first interlayer, the second interlayer including a second metal that has a property of cleaving a bond between the first metal and fluorine in the fluoride;
a cathode disposed on the second interlayer;
a sorption layer disposed above the cathode, the sorption layer including a third metal that has a property of taking up and holding at least one of moisture and oxygen; and
a sealing layer on the sorption layer, wherein
material included in the first interlayer and material included in the second interlayer are mixed,
in a layer including the first interlayer and the second interlayer, a component ratio of the second metal to the first metal is from 2% to 10%,
in the layer including the first interlayer and the second interlayer, a boundary between the first interlayer and the second interlayer is not defined,
the sorption layer includes a thickness from 5 nm to 12 nm,
the third metal includes the property of cleaving the bond between the first metal and the fluorine in the fluoride included in the first interlayer, and
the third metal is a same type of metal as the second metal.

2. The organic EL element of claim 1, wherein
each of the second metal and the third metal is an alkali metal or alkaline earth metal.

3. The organic EL element of claim 1, wherein
the cathode comprises a cathode thin film layer made from metal and a cathode auxiliary layer disposed on the cathode thin film layer, the cathode auxiliary layer having at least one of an electron transporting property and an electron injecting property.

4. The organic EL element of claim 3, wherein
the cathode thin film layer is made from one metal material or an alloy of a plurality of metal materials.

5. The organic EL element of claim 1, wherein
the second metal and the third metal are barium.

6. The organic EL element of claim 1, wherein
the first metal is sodium.

7. The organic EL element of claim 1, wherein
in the layer including the first interlayer and the second interlayer, concentration of the first metal is higher on a side of the light-emitting layer than on a side of the cathode, and
in the layer including the first interlayer and the second interlayer, concentration of the second metal is higher on the side of the cathode than on the side of the light-emitting layer.

8. The organic EL element of claim 1, wherein
in the layer including the first interlayer and the second interlayer, a thickness of the first interlayer is from 1 nm to 10 nm and a thickness of the second interlayer is from 0.2 nm to 1 nm.

9. The organic EL element of claim 1, wherein
a thickness of the layer including the first interlayer and the second interlayer is from 1.2 nm to 11 nm.

10. A method of manufacturing an organic EL element, the method comprising:
forming an anode;
forming a light-emitting layer above the anode;
forming a first interlayer of thickness D1 on the light-emitting layer, the first interlayer including a fluoride that includes a first metal that is an alkali metal or alkaline earth metal;
forming a second interlayer of thickness D2 on the first interlayer, the second interlayer including a second metal that has a property of cleaving a bond between the first metal and fluorine in the fluoride;

forming a cathode on the second interlayer;

forming a sorption layer above the cathode, the sorption layer including a third metal that has a property of taking up and holding moisture and oxygen; and forming a sealing layer on the sorption layer, wherein material included in the first interlayer and material included in the second interlayer are mixed, in a layer including the first interlayer and the second interlayer, a component ratio of the second metal to the first metal is from 2% to 10%, in the layer including the first interlayer and the second interlayer, a boundary between the first interlayer and the second interlayer is not defined, the sorption layer includes a thickness from 5 nm to 12 nm, the third metal includes the property of cleaving the bond between the first metal and the fluorine in the fluoride included in the first interlayer, and the third metal is a same type of metal as the second metal.

11. The method of claim 10, wherein
each of the second metal and the third metal is an alkali metal or alkaline earth metal.

12. The method of claim 10, wherein
the thickness D1 is from 1 nm to 10 nm.

13. The method of claim 10, wherein
the thickness D2 is from 0.2 nm to 1 nm.

14. The method of claim 10, wherein
the forming of the cathode includes the following:
forming a cathode thin film layer by using a metal material; and
forming a cathode auxiliary layer on the cathode thin film layer, the cathode auxiliary layer having at least one of an electron transporting property and an electron injecting property.

15. The method of claim 14, wherein
the cathode thin film layer is made from one metal material or an alloy of a plurality of metal materials.

16. The method of claim 10, wherein
the second metal and the third metal are barium.

17. The method of claim 10, wherein
the first metal is sodium.

18. The method of claim 10, wherein
in the layer including the first interlayer and the second interlayer, concentration of the first metal is higher on a side of the light-emitting layer than on a side of the cathode, and
in the layer including the first interlayer and the second interlayer, concentration of the second metal is higher on the side of the cathode than on the side of the light-emitting layer.

19. The method of claim 10, wherein
in the layer including the first interlayer and the second interlayer, the thickness D1 of the first interlayer is from 1 nm to 10 nm and the thickness D2 of the second interlayer is from 0.2 nm to 1 nm.

20. The method of claim 10, wherein
a thickness of the layer including the first interlayer and the second interlayer is from 1.2 nm to 11 nm.

* * * * *